United States Patent [19]

Roger

[11] Patent Number: 4,635,091
[45] Date of Patent: Jan. 6, 1987

[54] SEMICONDUCTOR DEVICE HAVING OVERLOAD PROTECTION

[75] Inventor: Bernard P. Roger, Carpiquet, France

[73] Assignee: U.S. Philips Corporation, New York, N.Y.

[21] Appl. No.: 639,642

[22] Filed: Aug. 10, 1984

[30] Foreign Application Priority Data

Aug. 17, 1983 [FR] France ............................. 83 13372

[51] Int. Cl.[4] .................... H01L 23/48; H01L 27/02; H01L 29/46; H01L 29/62
[52] U.S. Cl. ................................. 357/67; 357/23.13; 357/51; 357/65; 357/68; 357/71; 357/81
[58] Field of Search ................. 357/67, 71, 81, 23.13, 357/65, 68, 51

[56] References Cited

U.S. PATENT DOCUMENTS

| | | | |
|---|---|---|---|
| 3,925,808 | 12/1975 | Rai-Choudhury | 357/67 |
| 3,987,480 | 10/1976 | Diguet et al. | 357/67 |
| 4,151,545 | 4/1979 | Schnepf et al. | 357/67 |
| 4,392,010 | 7/1983 | Lindmayer | 357/67 |

*Primary Examiner*—J. Carroll
*Attorney, Agent, or Firm*—Robert T. Mayer; Steven R. Biren

[57] ABSTRACT

The transistor includes a semiconductor body having a surface on which are disposed metallic connection contact areas, including means for protection from overloads. At least one of the metallic area comprises a material, such as Al, susceptible to forming a eutectic with the substrate, which is made, for example, of Si. The metallic area is formed from an alloy of the material, such as the Al-Si eutectic, having a melting point whose temperature is lower than the formation temperature of the Al-Si eutectic and higher than the temperature of soldering the semiconductor body on a support.

8 Claims, 4 Drawing Figures

SEMICONDUCTOR DEVICE HAVING OVERLOAD PROTECTION

BACKGROUND OF THE INVENTION

The invention relates to a semiconductor device, more particularly a transistor, notably a power transistor, having a semiconductor body fixed by soldering on a support and having at its surface metallic connection contact areas, including means for protecting from overloads.

A known problem arises due to the lack of heat dissipation in transistors enclosed by a poorly heat-conducting material, notably by an envelope of plastic material. This phenomenon becomes manifest particularly in the case of power transistors for which the effect of an overload of current, of voltage or of energy generally results in the destruction of the two junctions which then form a shortcircuit.

If the transistor is used in a regulation device (for example, regulation of the speed of a motor, regulation of the voltage of an alternator, antilock brake system), the formation of a shortcircuit causes the regulation control to remain locked in its maximum position, which can become catastrophic.

Experience has shown that the shortcircuit is obtained at the transistor when during any overload a zone of small surface area of the semiconductor crystal, generally of silicon, is brought to a temperature such that formation of a eutectic between the semiconductor material and the metallized layer of the contact surface deposited at the surface occurs. This phenomenon becomes more rapid and frequent as the heat wave flows slowly, which is the case notably in devices enclosed by a plastic material.

Experience has also shown that the temperature which leads to this local formation of a eutectic of the semiconductor crystal and of the metallized layer is about 560° C. in the case of a metallized layer of aluminum and of a contact of silicon.

Semiconductor devices comprising integrated circuits, notably programmable memories, are already known, in which fuses are formed. However, as to these devices, the means used are not suitable to solve the problem caused by this undesired formation of a eutectic. Representative prior art devices are shown in U.S. Pat. No. 3,693,048 and Japanese Kokai No. 57-145.357.

Thus, in the case of programmable memories in the form of integrated circuits, the fusible elements have to be voluntarily and selectively destructed at predetermined and comparatively high values of current or energy, which lead to the use of materials which are very resistive and melt at very high temperatures, which are generally much higher than 1000° C.

SUMMARY OF THE INVENTION

To the contrary, the present invention is based on the idea that at a suitable area a fusible element is formed, whose melting point is adapted to that of the formation of the eutectic.

The invention thus relates to a semiconductor device, more particularly a power transistor, of the aforementioned kind, in which at least one of the said metallic surfaces comprises a material susceptible to forming a eutectic with the substrate, the metallic area being made of an alloy of the material having a melting point whose temperature is lower than the temperature of the formation of the eutectic and higher than the temperature of soldering the semiconductor body on its support.

The invention has consequently for its object to utilize a metallization layer melting at a temperature lower than 560° C., which is the temperature of the formation of the eutectic Al—Si, in the case of a contact layer of aluminum on a substrate of silicon, while on the one hand the crystal or semiconductor body can be mounted in a satisfactory manner on its support and on the other hand the connection wires can be soldered on the connection contact areas, on the understanding that the latter have to remain electrically conducting.

According to a preferred embodiment, a layer of the eutectic aluminum-germanium is chosen, in which magnesium and antimony may be added to adapt its characteristics.

The eutectic AlGe has a melting point of the order 420° C. which is sufficiently high to permit of soldering the semiconductor body, most frequently made of silicon, on its support, but is sufficiently low that the metallization melts at a point of a connection contact area formed in this layer so that the circuit is interrupted before a shortcircuit occurs in the interior of the semiconductor body.

The destruction of the transistor by the appearance of an interrupted circuit instead of a short-circuit permits suppressing the danger of overload and consequently permits protecting the elements in the proximity of the transistor.

If necessary, the metallic layer serving to obtain the connection contact areas is coated with a layer of pure aluminum having a small thickness with respect to the said metallic layer in order to guarantee a higher reliability of the contacts and the soldering areas of the wires and to improve the electrical and/or thermal conduction. Furthermore, a subjacent layer of pure aluminum also having a small thickness disposed under the metallic layer permits obtaining a better adherence to the substrate.

BRIEF DESCRIPTION OF THE DRAWING

In order that the invention may be readily carried out, it will now be described more fully, by way of example, with reference to the accompanying drawing, in which:

FIG. 1b shows a variation of FIG. 1a; and

DESCRIPTION OF THE PREFERRED EMBODIMENTS

Figure 1A:
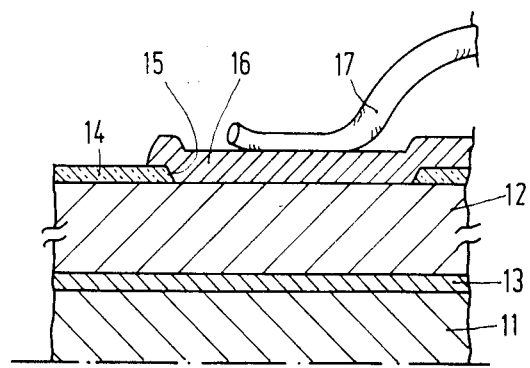
FIGS. 1a and 2 represent a detail of a device according to the invention showing a metallic area before and after fusion, respectively.
Figure 1B:
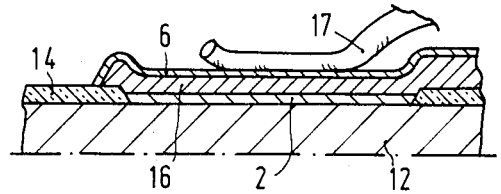

According to FIG. 1a, a semiconductor body 12 is soldered on a support 11 by means of a layer 13.

By way of example, the support 11 is made of copper coated with nickel. Before soldering, the lower surface of the body 12 of silicon is coated with a layer of gold 21, the layer 13 being obtained by formation of a eutectic Au—Si when the body 12 is provided on the support 11 at a temperature of approximately 400° C. In fact, it is known that the eutectic Au—Si is formed at 370° C.

In FIG. 1a, there is also represented a window 15 formed in an oxide layer 14 deposited on the upper surface of the semiconductor body 12. In this window is deposited a metallic layer 16, on which a connection wire 17 is soldered.

In the case in which the metallic layer 16 is made of aluminum and the semiconductor body 12 consists of silicon, a eutectic Au—Si is susceptible to be formed if the temperature locally reaches or exceeds 560° C. The aluminum of the layer 16 diffuses into the silicon of the body 12 and produces a shortcircuit.

According to the invention, the metallic layer 16 always contains aluminum, but it is formed in such a manner that its fusion occurs at a temperature lower than 560° C.

Figure 2:
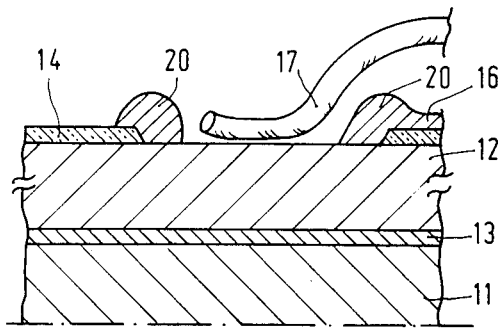

It then unexpectedly occurs that in the case of heating (see FIG. 2), the layer 16 in the liquid state is expelled from the zone in which it is in contact with the connection wire 17 and solidifies around the latter while forming a ring 20. The connection wire 17 is then spaced by a certain distance from the surface of the body 12 and the transistor is rendered inoperative by interruption of the flow of current and not by a shortcircuit.

The layer 16 is preferably formed from a eutectic Al—Ge which has a composition of 55% by weight of Ge and whose melting temperature is 423° C., much lower than the temperature of formation of the eutectic Al—Si (560° C.).

This temperature is higher, however, than that (370° C.) about which the body 12 can subsequently be soldered on the support 11 by formation of a eutectic Au—Si.

The layer 16 of Al—Ge having a thickness of about 3 to 6 μm can be deposited by evaporation in a vacuum chamber having two separate sources, one Ge source and one Al source, each being heated by an electron gun. The current in each electron gum permits controlling the evaporation rate. Consequently, the stoichiometry of the eutectic is obtained by causing the two electron guns to operate at suitable evaporaton rates. During the evaporation, the substrate 12 is held at a temperature lying between 150° and 300° C. and preferably at 250° C.

A subjacent layer 2 of pure aluminum having a thickness of about 50 to 100 Å can also be deposited by evaporation so that the adherence of the layer 16 to the substrate 12 of silicon is increased and the electrical quality of the contact is improved. Its thickness is small with respect to that of the layer 16 so as not to induce substantial modifications of the melting temperature of the layer 16.

Moreover, a layer 6 of pure aluminum having a thickness of about 20 to 100 Å can be advantageously deposited by evaporation above the layer 16 so that the oxidation of the germanium of the layer 16 during the storage of the substrate is avoided and any photo-etching treatment of the layer 16 is facilitated due to a better adherence of the lacquer.

The layer 6 has a small thickness with respect to the layer 16 for the same reason as above.

Other materials may be used for forming the layer 16, for example, the eutectic Al—Zn, which has a ponderal proportion of zinc of 95% and a melting temperature of 382° C., or the eutectic Al—Mg, which has a ponderal proportion of 67.8% of magnesium and a melting temperature of 437° C.

Further, ternary compounds may be obtained by adding a given proportion of Zn or Mg to the alloy Al—Ge, which produces eutectics also having adapted melting temperature.

Figure 3:
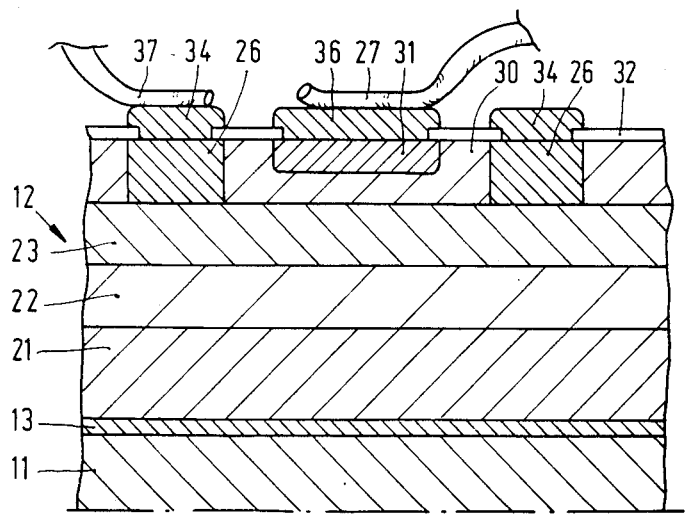
FIG. 3 shows a transistor according to the invention.

According to FIG. 3, the substrate 12 comprises a layer 22 of the n-type forming the collector of a transistor, a region 23 of the p-type forming a base region and a region 30 of the n-type forming an emitter region.

A well having a contour 26 in the form of a parallelepipedon or a ring and being strongly p*-doped surrounds the emitter region 24 in such a manner that a base contact region is formed between a metallization 34, on which a base contact wire 27 is soldered, and the base region 23.

The emitter region 30 has a central zone 31 which is strongly n+-doped and on which a metallization 36 is deposited, and on which an emitter contact wire 27 is soldered.

One or the other of the metallizations 34 or 36 in accordance with the invention is formed, if it contains a body of, for example, Al susceptible to forming a eutectic with the substrate 12, for example of Si, in a manner such that it has a melting point whose temperature is lower than the formation temperature of the said eutectic and higher than the soldering temperature of the semiconductor substrate (12) on its support (11).

It will be clear that in addition to bipolar transistors the invention can be used advantageously in other semiconductor devices, e.g. in insulated gate field effect transistors, thyristors etc.

What is claimed is:

1. A semiconductor device comprising a support, a semiconductor body soldered on said support and comprising a surface, metallic connection contact areas on said surface, at least one contact wire connected to one of said contact areas, and means for protecting said device from overloads, at least one of said metallic areas comprising a material capable of forming a eutectic with the semiconductor body formed from an alloy of said material having a melting point whose temperature is lower than the temperature of formation of said eutectic and higher than the temperature of soldering the semiconductor body on its support so that said at least one metallic area will melt prior to the formation of said eutectic upon overload of said device.

2. A device as claimed in claim 1, characterized in that said alloy comprises an aluminum-germanium eutectic.

3. A device as claimed in claim 2, characterized in that said alloy comprises at least one element of the group consisting of magnesium and antimony.

4. A device as claimed in claim 1, characterized in that said alloy comprises an aluminum-zinc eutectic.

5. A device as claimed in claim 1, characterized in that the said alloy comprises an aluminum-magnesium eutectic.

6. A device as claimed in claim 1 or 2, characterized in that at least said metallic area comprises a subjacent layer of aluminum having a substantially smaller thickness than that of said metallic area.

7. A device as claimed in claim 1 or 2, characterized in that at least said metallic area is coated with a layer of aluminum having a substantially smaller thickness than that of said metallic area.

8. A device as claimed in claim 1 or 2, wherein said device is a power transistor.

* * * * *